US008993449B2

(12) United States Patent
Morikawa et al.

(10) Patent No.: US 8,993,449 B2
(45) Date of Patent: Mar. 31, 2015

(54) ETCHING METHOD

(75) Inventors: Yasuhiro Morikawa, Susono (JP); Koukou Suu, Susono (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 13/386,213

(22) PCT Filed: Aug. 12, 2010

(86) PCT No.: PCT/JP2010/005053
§ 371 (c)(1),
(2), (4) Date: Mar. 20, 2012

(87) PCT Pub. No.: WO2011/018900
PCT Pub. Date: Feb. 17, 2011

(65) Prior Publication Data
US 2012/0171869 A1 Jul. 5, 2012

(30) Foreign Application Priority Data
Aug. 14, 2009 (JP) .................................. 2009-188148

(51) Int. Cl.
*H01L 21/302* (2006.01)
*H01L 21/3065* (2006.01)

(52) U.S. Cl.
CPC ............................... *H01L 21/30655* (2013.01)
USPC .................... 438/703; 438/710; 257/E21.214

(58) Field of Classification Search
USPC ................................................. 438/703–725
See application file for complete search history.

(56) References Cited

U.S. PATENT DOCUMENTS

| 6,077,451 A * | 6/2000 | Takenaka et al. ............... 216/79 |
| 2002/0179570 A1 | 12/2002 | Mathad et al. |
| 2007/0166844 A1* | 7/2007 | Morikawa et al. ................. 438/9 |
| 2008/0263093 A1 | 10/2008 | Alcorn et al. |

(Continued)

FOREIGN PATENT DOCUMENTS

| JP | 11-214356 A | 8/1999 |
| JP | 2002-367960 A * | 12/2002 .......... H01L 21/3065 |

(Continued)

OTHER PUBLICATIONS

International Search Report for PCT Patent App. No. PCT/JP2010/005053 (Nov. 9, 2010).

(Continued)

*Primary Examiner* — Savitr Mulpuri
(74) *Attorney, Agent, or Firm* — Cermak Nakajima & McGowan LLP; Tomoko Nakajima

(57) ABSTRACT

There is provided an etching method which can form trenches or via holes having desired aspect ratios and shapes in a to-be-processed object made of silicon. The etching method includes: a hydrogen halide-containing gas-based etching step of etching a silicon substrate by introducing a hydrogen halide-containing gas into a vacuum chamber; a fluorine-containing gas-based etching step of etching the silicon substrate by introducing a fluorine-containing gas into the vacuum chamber; a protective film formation step forming a protective film on the silicon substrate by sputtering a solid material; and a protective film removal step of removing part of the protective film by applying radio frequency bias power to a substrate electrode. The fluorine-containing gas-based etching step, the protective film formation step, and the protective film removal step are repeatedly performed in this order.

11 Claims, 3 Drawing Sheets

(56) References Cited

U.S. PATENT DOCUMENTS

| | | | |
|---|---|---|---|
| 2010/0102451 A1* | 4/2010 | Nishizawa | 257/773 |
| 2011/0117742 A1* | 5/2011 | Morikawa et al. | 438/696 |

FOREIGN PATENT DOCUMENTS

| | | | | |
|---|---|---|---|---|
| JP | 2009-046735 A | * | 3/2005 | ............ C23C 14/34 |
| JP | 2005-123550 A | | 5/2005 | |
| JP | 2009-046735 A | | 3/2009 | |
| TW | 200901313 A | | 1/2009 | |
| WO | WO2006/003962 A1 | | 1/2006 | |

OTHER PUBLICATIONS

Hong, X., "Introduction to Semiconductor Manufacturing Technology," May 2004, p. 332, third paragraph, Jen Chun, Lou & Ting Chang, Chang (translators).

Office Action from Taiwan Patent App. No. 099127397 (Dec. 25, 2013).

* cited by examiner

ETCHING METHOD

This application is a national phase entry under 35 U.S.C. §371 of PCT Patent Application No. PCT/JP2010/005053, filed on Aug. 12, 2010, which claims priority under 35 U.S.C. §119 to Japanese Patent Application No. 2009-188148, filed Aug. 14, 2009, both of which are incorporated by reference.

BACKGROUND OF THE INVENTION

1. Technical Field

The invention relates to an etching method, and more specifically to a method of etching a to-be-processed object made of silicon.

2. Background of the Art

In recent years, with an increase in the degree of integration of semiconductor devices, dimensions of individual elements have been decreasing. Accordingly, a high aspect ratio (depth of a trench (or a via hole)/diameter of the trench (or the via hole)) is required for trenches (grooves) or via holes (holes) formed in a silicon substrate in order to ensure element isolation and memory cell capacitor area.

Conventional methods of forming trenches or via holes in a silicon substrate include a method in which the silicon substrate is etched using fluorine radicals produced by forming a plasma of a fluorine-containing gas. In this case, since the reaction of fluorine radicals and silicon spontaneously proceeds, etching at room temperature is isotropic. Accordingly, a method has been employed in which after the silicon substrate is etched to form part of the trenches or the via holes, a protective film is formed on sidewalls thereof, and then etching is further performed (e.g., see Patent Document 1).

PRIOR ART DOCUMENT

Patent Document

Patent Document 1: International Patent Application Publication No. WO2006/003962

SUMMARY

Problems to be Solved by the Invention

In the above-described conventional method, sidewalls are inhibited from being etched, by forming a protective film. However, since trenches or via holes are formed by repeating an etching step and a protective film formation step, there has been a problem in that irregularities occur on sidewalls thereof, and the like. Moreover, with regard to the etching of a silicon substrate, after a mask having a predetermined shape is formed on the silicon substrate, portions exposed to the outside from the mask are etched. Here, fluorine radicals easily move around to portions directly under the mask, and the protective film therein is prone to damage. Accordingly, there have also been problems in that, as the etching in the depth direction proceeds, the sidewalls are also etched, and therefore that trenches or via holes having desired shapes cannot be obtained.

The above-described problems become significant in the case where trenches or via holes having high aspect ratios are to be formed. In this regard, an object of the invention is to provide an etching method which enables trenches or via holes having desired aspect ratios and shapes to be formed in a to-be-processed object made of silicon.

Other objects and advantages of the invention will become apparent from the following description.

Means for Solving the Problems

According to a first aspect of the present invention, there is provided a method in which a plasma is generated in a processing chamber to etch a to-be-processed object made of silicon on a substrate electrode disposed in the processing chamber. The method includes a hydrogen halide-containing gas-based etching step of etching the to-be-processed object by introducing a hydrogen halide-containing gas into the processing chamber, a fluorine-containing gas-based etching step of etching the to-be-processed object by introducing a fluorine-containing gas into the processing chamber, a protective film formation step of forming a protective film on the to-be-processed object by sputtering a solid material disposed to face the to-be-processed object, and a protective film removal step of removing part of the protective film by applying radio frequency bias power to the substrate electrode, in which the fluorine-containing gas-based etching step, the protective film formation step, and the protective film removal step are repeatedly performed in this order.

In the above-described repeating step, it is required only to repeat the fluorine-containing gas-based etching step, the protective film formation step, and the protective film removal step in this order. Either of the fluorine-containing gas-based etching step and the protective film formation step may be the first to be performed.

According to the first aspect of the invention, the hydrogen halide-containing gas-based etching step is preferably performed first. In other words, a mask having a predetermined shape has been formed on the surface of the to-be-processed object, and silicon directly under this mask is preferably etched using the hydrogen halide-containing gas.

According to the first aspect of the invention, the fluorine-containing gas-based etching step, the protective film formation step, and the protective film removal step may be repeatedly performed in this order after the hydrogen halide-containing gas-based etching step.

Moreover, according to the first aspect of the invention, the hydrogen halide-containing gas-based etching step may also be performed after the fluorine-containing gas-based etching step, the protective film formation step, and the protective film removal step are repeatedly performed in this order.

Further, according to the first aspect of the invention, the hydrogen halide-containing gas-based etching step and a step of repeatedly performing the fluorine-containing gas-based etching step, the protective film formation step, and the protective film removal step in this order may also be alternately performed.

According to a second aspect of the invention, there is provided a method in which a plasma is generated in a processing chamber to etch a to-be-processed object made of silicon on a substrate electrode disposed in the processing chamber. The method comprises a hydrogen halide-containing gas-based etching step of etching the to-be-processed object by introducing a hydrogen halide-containing gas into the processing chamber, a protective film formation step of forming a protective film on the to-be-processed object by sputtering a solid material disposed to face the to-be-processed object, and a fluorine-containing gas-based etching step of etching the to-be-processed object while removing part of the protective film, by introducing a fluorine-containing gas into the processing chamber and applying radio frequency bias power to the substrate electrode, in which the protective film formation step and the fluorine-containing gas-based etching step are repeatedly performed in this order.

According to the second aspect of the invention, the hydrogen halide-containing gas-based etching step is preferably performed first. Specifically, a mask having a predetermined shape has been formed on a surface of the to-be-processed object, and silicon right under this mask is preferably etched using the hydrogen halide-containing gas.

According to the second aspect of the invention, the protective film formation step and the fluorine-containing gas-based etching step may be repeatedly performed in this order after the hydrogen halide-containing gas-based etching step.

Moreover, according to the second aspect of the invention, the hydrogen halide-containing gas-based etching step may also be performed after the protective film formation step and the fluorine-containing gas-based etching step are repeatedly performed in this order.

Further, according to the second aspect of the invention, the hydrogen halide-containing gas-based etching step and a step of repeatedly performing the protective film formation step and the fluorine-containing gas-based etching step in this order may also be alternately performed.

According to the first and second aspects of the invention, the hydrogen halide-containing gas preferably contains fluorine.

According to the first and second aspects of the invention, the hydrogen halide may be at least one selected from the group consisting of hydrogen iodide, hydrogen chloride, and hydrogen bromide.

According to the first and second aspects of the invention, the fluorine-containing gas may contain at least one selected from the group consisting of sulfur hexafluoride gas, nitrogen trifluoride gas, fluorine gas, silicon tetrafluoride gas, xenon difluoride gas, iodine fluoride gas, and fluorocarbon iodide gas.

According to the first and second aspects of the invention, the solid material may be formed by using a material selected from the group consisting of fluoropolymer, silicon, carbon, silicon carbide, silicon oxide, and silicon nitride.

Effects of the Invention

According to the first aspect of the invention, the method comprises the hydrogen halide-containing gas-based etching step, the fluorine-containing gas-based etching step, a protective film formation step, and the protective film removal step. The fluorine-containing gas-based etching step, the protective film formation step, and the protective film removal step are repeatedly performed in this order. Accordingly, trenches or via holes having desired aspect ratios and shapes can be formed in a to-be-processed object made of silicon.

According to the second aspect of the invention, the method comprises the hydrogen halide-containing gas-based etching step, the protective film formation step, and the fluorine-containing gas-based etching step. The protective film formation step and the fluorine-containing gas-based etching step are repeatedly performed in this order. Accordingly, trenches or via holes having desired aspect ratios and shapes can be formed in a to-be-processed object made of silicon. Moreover, in the fluorine-containing gas-based etching step, since the to-be-processed object is etched while part of the protective film is being removed, the total number of steps can be reduced.

Figure 3:
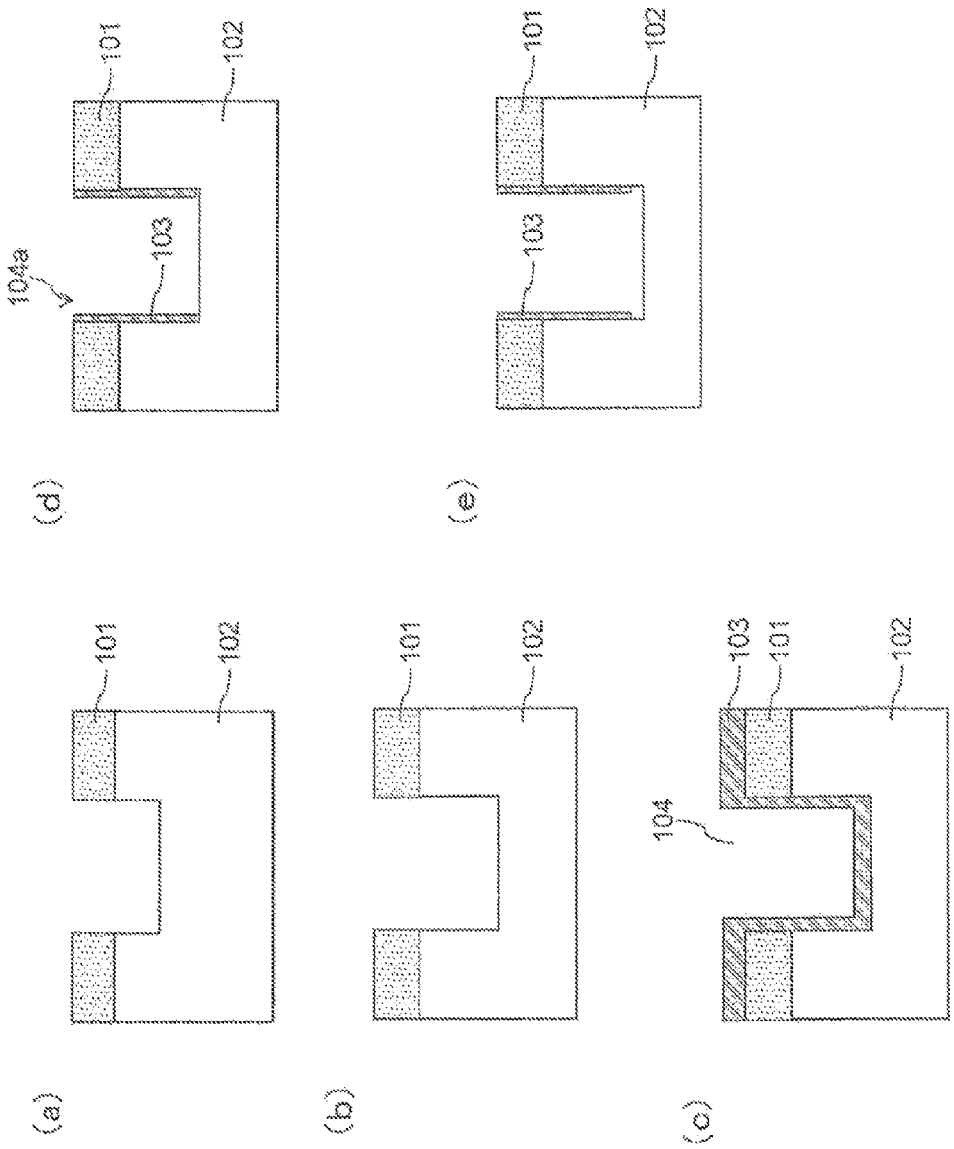

Parts (a) to (e) of FIG. 3 are schematic partial sectional views of a silicon substrate.

MODES FOR CARRYING OUT THE INVENTION

Figure 1:
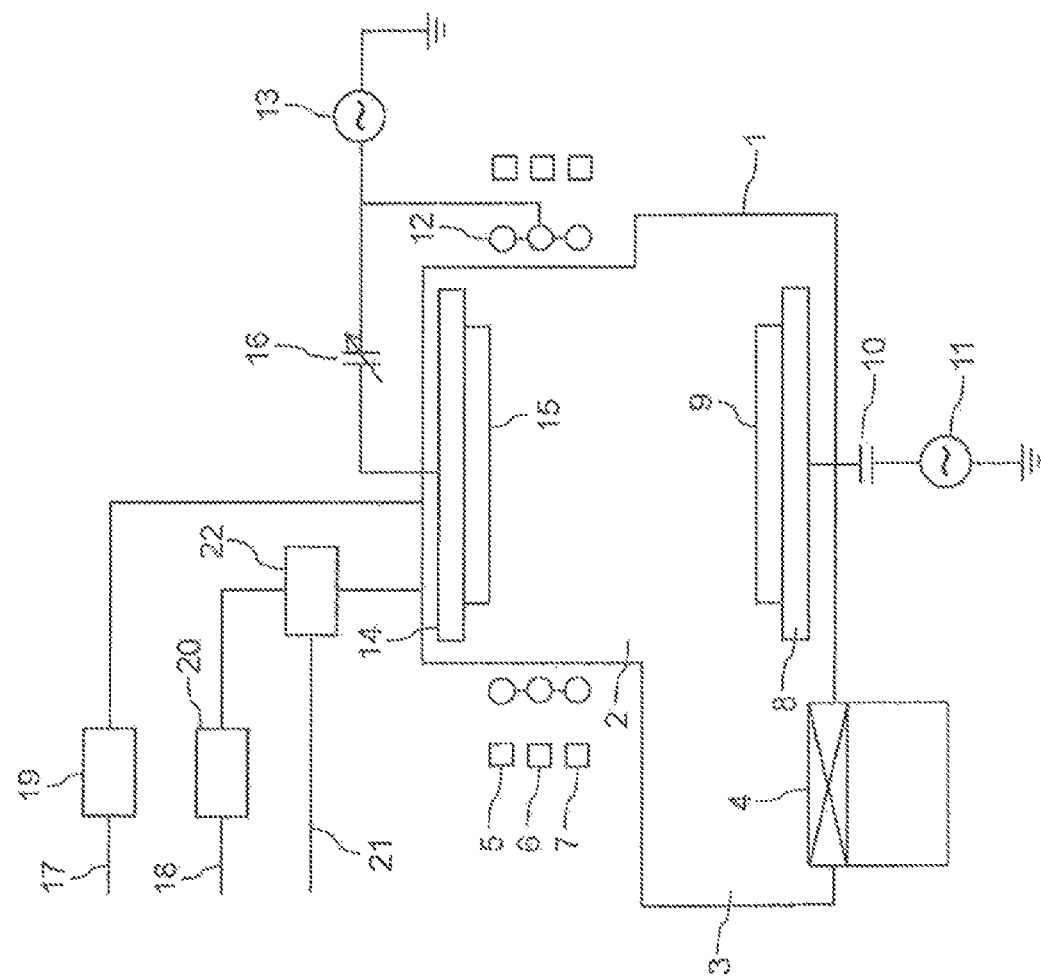
FIG. 1 is a view showing an NLD etching apparatus used in this embodiment.

FIG. 1 shows an etching apparatus of an NLD (Magnetic Neutral Loop Discharge) type used in this embodiment. The NLD type can control the diameter and size of a plasma, and therefore has the advantage in that high-accuracy etching and sputtering can be performed compared with an ordinary type. Thus, the NLD type is preferably used in the invention. It should be noted, however, that the invention is not limited to the NLD types, and etching apparatuses of other types may be used as long as a plasma can be generated.

In FIG. 1, a vacuum chamber 1 as a processing chamber includes a plasma generating portion 2 in an upper part thereof and a substrate processing portion 3 in a lower part thereof. The substrate processing portion 3 is provided with an exhaust port 4, and the exhaust port 4 is connected to an appropriate exhaust system (not illustrated). Moreover, three magnetic coils 5, 6, 7 are provided on the outside of the plasma generating portion 2. These magnetic coils form a magnetic neutral line inside the vacuum chamber 1.

The substrate processing portion 3 is provided with a substrate electrode 8, and a silicon substrate 9 as a to-be-processed object is placed on the substrate electrode 8. Moreover, the substrate electrode 8 is connected to a radio frequency bias power source 11 for applying RF bias through a blocking capacitor 10.

Three radio frequency antenna coils 12 for plasma generation are disposed between the plasma generating portion 2 and the three magnetic coils 5, 6, 7. These radio frequency antenna coils 12 are connected to a radio frequency power source 13, and are configured to be capable of applying an alternating electric field along a magnetic neutral line formed in the plasma generating portion 2 by the three magnetic coils 5, 6, 7. This makes it possible to generate a discharge plasma along the magnetic neutral line.

A top plate in the plasma generating portion 2 is held at a floating potential, and functions as a floating electrode 14. A solid material 15 is attached to the floating electrode 14. The solid material 15 is formed by using, for example, fluoropolymer, silicon, carbon, silicon carbide, silicon oxide, silicon nitride, or the like.

A feed line leading from the radio frequency power source 13 to the radio frequency antenna coils 12 is branched on the way (at a point therebetween) to run through a variable capacitor 16 to the floating electrode 14. Thus, radio frequency power is intermittently applied from the radio frequency power source 13 to the floating electrode 14, and self-bias is generated in the floating electrode 14. It should be noted that a switch can also be used instead of the variable capacitor 16. Moreover, a radio frequency power source for the floating electrode 14 and a radio frequency power source for the radio frequency antenna coils 12 may be separately provided.

A supply channel 17 for supplying a hydrogen halide-containing gas and a supply channel 18 for supplying a fluorine-containing gas are connected to the vacuum chamber 1. A control device 19 is provided in the middle of the supply channel 17, and controls the supply of the hydrogen halide-containing gas, the stoppage thereof, and the flow rate during the supply. Moreover, a control device 20 is provided also in the middle of the supply channel 18, and controls the supply of the fluorine-containing gas, the stoppage thereof, and the flow rate during the supply.

A supply channel 21 for supplying a noble gas is connected to the supply channel 18 downstream of the control device 20 so that the fluorine-containing gas and the noble gas may become mixed with each other in a gas mixing portion 22. Thus, a mixed gas of the two gases can be supplied to the vacuum chamber 1. Moreover, it is also possible to supply only the noble gas to the vacuum chamber 1 by stopping the supply of the fluorine-containing gas using the control device 20. It should be noted that in this embodiment, a supply channel for the fluorine-containing gas and a supply channel for the noble gas may be separately provided.

As the hydrogen halide, for example, hydrogen iodide, hydrogen chloride, or hydrogen bromide can be used. The hydrogen halide-containing gas may contain a gas other than hydrogen halide, and, in particular, preferably contains fluorine or oxygen. By containing fluorine, etch rate increases to thereby improve throughput. Moreover, by containing oxygen, a product material formed by the reaction of hydrogen halide and silicon is caused to be decomposed, thus allowing the smooth proceeding of etching.

The fluorine-containing gas may be sulfur hexafluoride ($SF_6$) gas, nitrogen trifluoride ($NF_3$) gas, fluorine ($F_2$) gas, silicon tetrafluoride ($SiF_4$) gas, xenon difluoride ($XeF_2$) gas, iodine fluoride ($IF_5$ or $IF_7$) gas, fluorocarbon iodide gas, or the like, and is preferably sulfur hexafluoride. Moreover, the noble gas may be argon (Ar), xenon (Xe), krypton (Kr), nitrogen ($N_2$), or the like.

Next, a method of etching the silicon substrate 9 using the etching apparatus of FIG. 1 will be described.

First, the hydrogen halide-containing gas is introduced into the vacuum chamber 1 to etch the silicon substrate 9. Here, a mask (not illustrated) having a predetermined pattern is assumed to be provided on a surface of the silicon substrate 9. By etching the silicon substrate 9 exposed from the mask, trenches or via holes having desired shapes can be formed in desired portions of the silicon substrate 9. It should be noted that the mask may be an inorganic material such as $SiO_2$, or may be a photo resist made of an acrylic resin, a silicone resin, or the like, or a thermosetting resist made of an epoxy resin or the like. The mask is removed by ashing or the like after the formation of trenches or via holes is finished.

To be specific, the control device 19 is activated to introduce the hydrogen halide-containing gas into the vacuum chamber 1. At this time, the variable capacitor 16 is turned into an OFF state so that radio frequency power may not be supplied to the floating electrode 14. On the other hand, the radio frequency bias power source 11 is turned into an ON state so that radio frequency power may be supplied to the substrate electrode 8. Moreover, power for plasma generation is supplied from the radio frequency power source 13 to the radio frequency antenna coils 12. Thus, the silicon substrate 9 is etched.

As one example, by using a mixed gas of HBr, $SF_6$, and $O_2$ as the hydrogen halide-containing gas and by using He gas as the noble gas, etching was performed under the following conditions: the pressure in the vacuum chamber was 2 Pa, the output of the radio frequency power source was 2000 W, the output of the radio frequency bias power source was 100 W, and the frequency of the radio frequency bias power source was 12.56 MHz. Then, the etch rate was found to be 5.75 μm/min. It should be noted that the respective flow rates of the etching gases were as follows: 75 sccm for HBr gas, 50 sccm for $SF_6$ gas, and 100 sccm for $O_2$ gas. Moreover, the pressure of He gas was 1330 Pa, the temperature was −20° C., and the etching time was 120 seconds. As a result, an opening portion having a smooth sidewall was formed.

By etching using hydrogen halide, an anisotropic shape can be obtained. In other words, etching can be proceeded while inner walls of trenches or via holes are inhibited from being formed into bowing shapes. However, in this etching, since the selectivity to the mask is not large, the mask may disappear with the proceeding of the etching. In this regard, when the etching has been performed to a predetermined depth, the etching gas is switched to the fluorine-containing gas.

To be specific, the control device 19 stops the supply of the hydrogen halide-containing gas, and the control device 20 is activated. Thus, the noble gas is mixed with the hydrogen halide-containing gas in the gas mixing portion 22, and the mixed gas of the two gases is introduced into the vacuum chamber 1. At this time, the variable capacitor 16 and the radio frequency bias power source 11 are turned into OFF states so that the radio frequency power may not be supplied to the floating electrode 14 and the substrate electrode 8. Then, the power for plasma generation is supplied from the radio frequency power source 13 to the radio frequency antenna coils 12 to etch the silicon substrate 9.

In the etching using the fluorine-containing gas, the reaction of fluorine radicals and silicon causes the etching to proceed. This etching provides a high selectivity to the mask, but cannot provide anisotropic shapes due to being isotropic. Accordingly, bowing shapes occur in which inner walls of trenches or via holes expand in arched shapes. To prevent this, the sidewall is protected from etching by forming a protective film on the sidewall.

To be specific, when the etching using the fluorine-containing gas has been performed for a predetermined period of time, the control device 20 stops the supply of the fluorine-containing gas so that only the noble gas may be supplied into the vacuum chamber 1. Moreover, in a state in which the radio frequency bias power source 11 is turned OFF, the variable capacitor 16 is turned ON, and also the output of the radio frequency power source 13 is increased. Thus, radio frequency power is not supplied to the substrate electrode 8, but is applied to the floating electrode 14. Then, the solid material 15 attached to the floating electrode 14 is sputtered to form a protective film (not illustrated) on the silicon substrate 9. For example, in the case where a fluoropolymer is used as the solid material 15, a fluoropolymer film is formed on the silicon substrate 9.

Next, the variable capacitor 16 is turned OFF to stop the application of the radio frequency power to the floating electrode 14. Then, the radio frequency bias power source 11 is turned ON to apply the radio frequency power to the substrate electrode 8. Thus, except for sidewalls of trenches or via holes, the protective film formed on a surface of the silicon substrate 9 and a surface approximately parallel to the foregoing surface is removed. It should be noted that in this case, though the fluorine-containing gas may be introduced by activating the control device 20, only the noble gas may be introduced without introducing the fluorine-containing gas.

Figure 2:
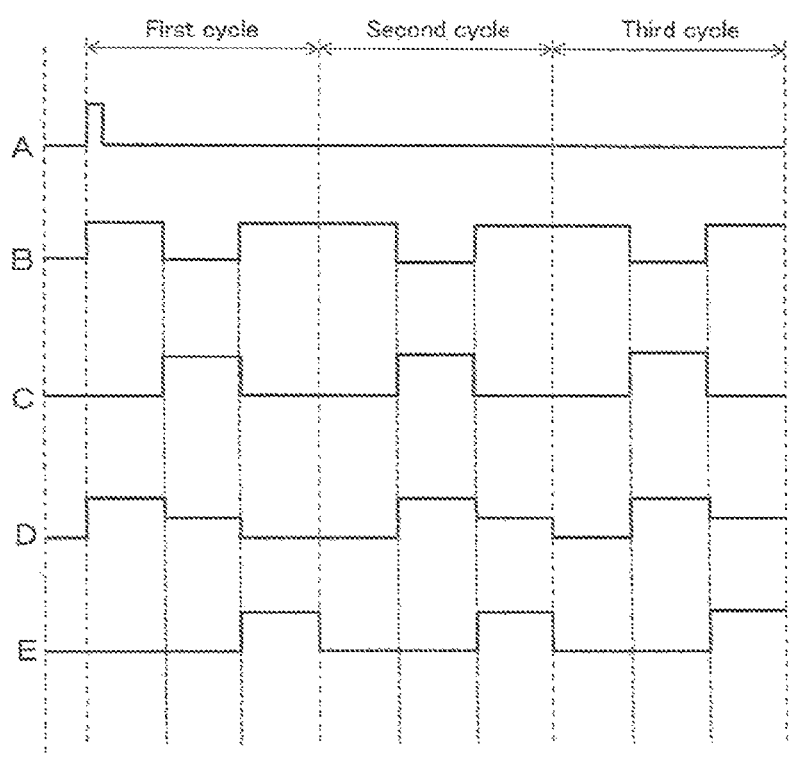
FIG. 2 is a sequence of a fluorine-containing gas-based etching step, a protective film formation step, and a protective film removal step in this embodiment.

FIG. 2 is a sequence of a fluorine-containing gas-based etching step, a protective film formation step, and a protective film removal step. In this example, the above-described steps constitute one cycle, and timing for three cycles is shown. It should be noted that in FIG. 2, signal A indicates a trigger signal, signal B indicates a signal indicating the control timing of the control device 20 for the fluorine-containing gas, signal C indicates a signal indicating the control timing of the variable capacitor 16, signal D indicates a signal indicating the control timing of the radio frequency power source 13, and signal E indicates a signal indicating the control timing of the radio frequency bias power source 11.

In FIG. 2, after the first cycle is finished, the second cycle is performed, and then the third cycle is performed. Specifically, after the etching→ the protective film formation→ the protective film removal of the first cycle is performed, the second cycle is started to perform etching using the fluorine-containing gas. This makes it possible to further etch the silicon substrate in the depth direction thereof while preventing the etching of the sidewall by means of the protective film. When the etching has been performed to a predetermined depth, a protective film is formed on the sidewall again. After that, the third cycle is started to similarly perform the etching→ the protective film formation→ the protective film removal. Repeating the above-described steps even after the third cycle has been finished enables the etching in the depth direction of the silicon substrate to proceed while protecting the sidewall. It should be noted that the number of repetitions of the above-described cycle is appropriately set according to desired shapes of trenches or via holes.

Parts (a) to (e) of FIG. 3 are schematic partial sectional views of a silicon substrate, and show each of the steps of an etching method according to the invention.

First, as shown in Part (a) of FIG. 3, a silicon substrate 102 exposed to the outside from a mask 101 is etched to a predetermined depth by etching using hydrogen halide.

Next, the etching gas is switched to the fluorine-containing gas, and the silicon substrate 102 is further etched. Thus, a shape shown in Part (b) of FIG. 3 is obtained.

Subsequently, the supply of the fluorine-containing gas is stopped, and a protective film 103 is formed on the silicon substrate 102 as shown in Part (c) of FIG. 3. The protective film 103 is formed to cover the top of the mask 101 and the inside of an opening portion 104.

Next, while leaving the a sidewall 104a of the opening portion 104 as it is, the protective film 103 formed on a surface of the silicon substrate 102 and a surface approximately parallel to the foregoing surface is removed. Thus, a structure shown in Part (d) of FIG. 3 is obtained. After that, etching using the fluorine-containing gas is performed again to etch the silicon substrate 102 to a further depth (Part (e) of FIG. 3).

As described above, according to this embodiment, after the etching step using the hydrogen halide-containing gas is performed, the etching step using the fluorine-containing gas, the protective film formation step, and the protective film removal step are repeatedly performed. This makes it possible to smooth the sidewalls of the trenches or via holes and to etch a silicon substrate in the depth direction thereof. This is considered to be due to the following reasons.

By the conventional method in which trenches or via holes are formed by repeatedly performing only an isotropic etching step using fluorine radicals and the step of forming a protective film on sidewalls, it is difficult to form smooth sidewalls without irregularities. However, as in the invention, anisotropic etching using hydrogen halide can form smooth sidewalls. Moreover, fluorine radicals easily move around to portions right under the mask, and the protective film therein is prone to damage. However, it is possible to reduce damage to the foregoing portions by fluorine radicals by employing etching using hydrogen halide. Then, after this etching, by repeating etching using the fluorine-containing gas and the forming of a protective film on sidewalls to thereby cause the etching in the depth direction to proceed, trenches or via holes with high aspect ratios can be formed while maintaining favorable shapes as they are. It should be noted that, since attack by fluorine radicals on portions directly under the mask decreases as the etching in the depth direction proceeds, there is little or no possibility that etching step using the fluorine-containing gas would result in a state in which irregularities occur on the sidewalls that are formed in smooth shape.

It should be noted that the invention is not limited to the above-described embodiment but can be variously modified without departing from the spirit of the invention.

For example, in the above-described embodiment, after etching using the hydrogen halide-containing gas is performed, etching using the fluorine-containing gas, protective film formation, and protective film removal are repeatedly performed. However, the invention is not limited to this.

In the invention, etching using the hydrogen halide-containing gas may be performed after etching using the fluorine-containing gas, protective film formation, and protective film removal are repeatedly performed. Moreover, the following steps may be repeated: etching using the hydrogen halide-containing gas is performed; then, etching using the fluorine-containing gas, protective film formation, and protective film removal are repeatedly performed; etching using the hydrogen halide-containing gas is performed again; and then, etching using the fluorine-containing gas, protective film formation, and protective film removal are repeatedly performed. Further, the following steps may be repeated: etching using the fluorine-containing gas, protective film formation, and protective film removal are repeatedly performed; then, etching using the hydrogen halide-containing gas is performed; etching using the fluorine-containing gas, protective film formation, and protective film removal are repeated again; and then, etching using the hydrogen halide-containing gas is performed. In any of the above-described cases, effects of the invention can be obtained.

Moreover, in the above-described embodiment, at the time of etching using the fluorine-containing gas, the radio frequency bias power source 11 is turned into an OFF state so that radio frequency power may not be supplied to the substrate electrode 8 of FIG. 1. However, in the invention, etching using the fluorine-containing gas may be performed while radio frequency bias power is being applied. According to this method, the etching of a silicon substrate and protective film removal can be simultaneously performed. Accordingly, in addition to the effect of etching a silicon substrate in the depth direction thereof while smoothing sidewalls of trenches or via holes, the effect of reducing the total number of steps can also be obtained.

The above-described method includes the step of etching a silicon substrate by introducing a hydrogen halide-containing gas into a vacuum chamber, and the step of repeating the following: forming a protective film on the silicon substrate by sputtering a solid material disposed to face the silicon substrate, and then etching the silicon substrate while removing part of the protective film, by introducing a fluorine-containing gas into the vacuum chamber and applying radio frequency bias power to a substrate electrode. In this case, the protective film formation step and the fluorine-containing gas-based etching step may be repeatedly performed in this order after the hydrogen halide-containing gas-based etching step. Moreover, the hydrogen halide-containing gas-based etching step may also be performed after the protective film formation step and the fluorine-containing gas-based etching step are repeatedly performed in this order. Further, the hydrogen halide-containing gas-based etching step and the step of repeating the protective film formation step and the fluorine-containing gas-based etching step in this order may also be alternately performed.

EXPLANATION OF REFERENCE NUMERALS

1 Vacuum Chamber
2 Plasma Generating Portion

3 Substrate Processing Portion
4 Exhaust Port
5, 6, 7 Magnetic Coil
8 Substrate Electrode
9 Silicon Substrate
10 Blocking Capacitor
11 Radio Frequency Bias Power Source
12 Radio Frequency Antenna Coil
13 Radio Frequency Power Source
14 Floating Electrode
15 Solid Material
16 Variable Capacitor
17, 18, 21 Supply Channel
19, 20 Control Device
22 Gas Mixing Portion
101 Mask
102 Silicon Substrate
103 Protective Film
104 Opening Portion

What is claimed is:

1. An etching method for trenches or via holes having high aspect ratio by an NLD type etching apparatus in which a plasma is generated in a processing chamber by radio frequency antenna coils to etch a to-be-processed object made of silicon on a substrate electrode disposed in the processing chamber, the etching method comprising:
    a hydrogen halide-containing gas-based etching step of etching the to-be-processed object by introducing a hydrogen halide-containing gas into the processing chamber, power being supplied to the substrate electrode and to the radio frequency antenna coils during the hydrogen halide-containing gas-based etching step;
    a fluorine-containing gas-based etching step of etching the to-be-processed object by introducing a fluorine-containing gas into the processing chamber, power being not supplied to the substrate electrode during the fluorine-containing gas-based etching step;
    a protective film formation step of forming a protective film on the to-be-processed object by sputtering a solid material disposed to face the to-be-processed object; and
    a protective film removal step of removing part of the protective film by applying radio frequency bias power to the substrate electrode,
    wherein the hydrogen halide-containing gas-based etching step is performed first to etch the to-be-processed object made of silicon so as to prevent damage under a mask by etching trenches or via holes having high aspect ratio by the fluorine-containing gas, and thereafter the fluorine-containing gas-based etching step, the protective film formation step, and the protective film removal step are repeated in this order, and
    wherein the hydrogen halide is at least one selected from the group consisting of hydrogen iodide, hydrogen chloride, and hydrogen bromide.

2. The etching method according to claim 1, wherein the hydrogen halide-containing gas-based etching step and a step of repeatedly performing the fluorine-containing gas-based etching step, the protective film formation step, and the protective film removal step in this order are alternately performed.

3. An etching method for trenches or via holes having high aspect ratio by an NLD type etching apparatus in which a plasma is generated in a processing chamber by radio frequency antenna coils to etch a to-be-processed object made of silicon on a substrate electrode disposed in the processing chamber, the etching method comprising:
    a hydrogen halide-containing gas-based etching step of etching the to-be-processed object by introducing a hydrogen halide-containing gas into the processing chamber, power being supplied to the substrate electrode and to the radio frequency antenna coils during the hydrogen halide-containing gas-based etching step;
    a protective film formation step of forming a protective film on the to-be-processed object by sputtering a solid material disposed to face the to-be-processed object; and
    a fluorine-containing gas-based etching step of etching the to-be-processed object while removing part of the protective film, by introducing a fluorine-containing gas into the processing chamber, power being not supplied to the substrate electrode during the fluorine-containing gas-based etching step,
    wherein the hydrogen halide-containing gas-based etching step is performed first to etch the to-be-processed object made of silicon so as to prevent damage under a mask by etching trenches or via holes having high aspect ratio by the fluorine-containing gas, and thereafter the protective film formation step and the fluorine-containing gas-based etching step are repeatedly performed in this order, and
    wherein the hydrogen halide is at least one selected from the group consisting of hydrogen iodide, hydrogen chloride, and hydrogen bromide.

4. The etching method according to claim 3, wherein the hydrogen halide-containing gas-based etching step and a step of repeatedly performing the protective film formation step and the fluorine-containing gas-based etching step in this order are alternately performed.

5. The etching method according to claim 1, wherein the hydrogen halide-containing gas contains fluorine.

6. The etching method according to claim 1, wherein the fluorine-containing gas contains at least one selected from the group consisting of sulfur hexafluoride gas, nitrogen trifluoride gas, fluorine gas, silicon tetrafluoride gas, xenon difluoride gas, iodine fluoride gas, and fluorocarbon iodide gas.

7. The etching method according to claim 1, wherein the solid material is formed by using a material selected from the group consisting of fluoropolymer, silicon, carbon, silicon carbide, silicon oxide, and silicon nitride.

8. The etching method according to claim 3, wherein the hydrogen halide-containing gas contains fluorine.

9. The etching method according to claim 3, wherein the hydrogen halide is at least one selected from the group consisting of hydrogen iodide, hydrogen chloride, and hydrogen bromide.

10. The etching method according to claim 3, wherein the fluorine-containing gas contains at least one selected from the group consisting of sulfur hexafluoride gas, nitrogen trifluoride gas, fluorine gas, silicon tetrafluoride gas, xenon difluoride gas, iodine fluoride gas, and fluorocarbon iodide gas.

11. The etching method according to claim 3, wherein the solid material is formed by using a material selected from the group consisting of fluoropolymer, silicon, carbon, silicon carbide, silicon oxide, and silicon nitride.

* * * * *